United States Patent
Gero et al.

[11] Patent Number: 5,948,300
[45] Date of Patent: Sep. 7, 1999

[54] PROCESS TUBE WITH IN-SITU GAS PREHEATING

[75] Inventors: Lawrence R. Gero; David M. Rowell, both of Billerica, Mass.

[73] Assignee: Kokusai BTI Corporation, North Billerica, Mass.

[21] Appl. No.: 08/929,163

[22] Filed: Sep. 12, 1997

[51] Int. Cl.⁶ .................................................. C23C 16/00
[52] U.S. Cl. .......................................... 219/390; 118/725
[58] Field of Search ................................... 219/390, 405, 219/411; 392/416, 418; 118/715, 724, 725; 432/152; 428/795

[56] References Cited

U.S. PATENT DOCUMENTS

| | | | |
|---|---|---|---|
| 3,811,826 | 5/1974 | Enderlein | 432/200 |
| 4,347,431 | 8/1982 | Pearce et al. | 219/390 |
| 4,369,031 | 1/1983 | Goldman et al. | 432/198 |
| 4,597,736 | 7/1986 | Moffat | 432/26 |
| 4,738,618 | 4/1988 | Massey et al. | 432/241 |
| 4,911,638 | 3/1990 | Bayne et al. | 432/152 |
| 4,937,434 | 6/1990 | Nakao | 219/390 |
| 4,954,685 | 9/1990 | Kumagai et al. | 319/390 |
| 5,001,327 | 3/1991 | Hirasawa et al. | 219/390 |
| 5,076,206 | 12/1991 | Bailey et al. | 118/724 |
| 5,116,784 | 5/1992 | Ushikawa | 437/225 |
| 5,146,869 | 9/1992 | Bohannon et al. | 118/724 |
| 5,178,534 | 1/1993 | Bayne et al. | 432/152 |
| 5,225,378 | 7/1993 | Ushikawa | 437/233 |
| 5,279,670 | 1/1994 | Watanabe et al. | 118/725 |
| 5,320,680 | 6/1994 | Learn et al. | 118/724 |
| 5,407,181 | 4/1995 | Ohsawa | 266/257 |
| 5,443,648 | 8/1995 | Ohkase | 118/724 |
| 5,445,522 | 8/1995 | Miyagi et al. | 432/156 |
| 5,458,685 | 10/1995 | Hasebe et al. | 118/724 |
| 5,464,313 | 11/1995 | Ohsawa | 414/172 |
| 5,482,558 | 1/1996 | Watanabe et al. | 118/728 |
| 5,520,742 | 5/1996 | Ohkase | 118/724 |
| 5,540,098 | 7/1996 | Ohsawa | 73/629 |
| 5,561,088 | 10/1996 | Sameshima | 437/247 |
| 5,586,880 | 12/1996 | Ohsawa | 432/241 |

*Primary Examiner*—Joseph Pelham
*Attorney, Agent, or Firm*—Weingarten, Schurgin, Gagnebin & Hayes LLP

[57] ABSTRACT

A semiconductor wafer furnace process tube includes one or more gas delivery lines which wind around the circumference of the process tube in a non-product region near one end to preheat the gas in the lines. The winding section begins within the non-product region of the heater and terminates prior to the location of the first wafer within the process tube. From the termination of the winding section, the delivery lines continue axially directly to the opposite end of the tube. The length of the lines within the winding section is preselected to adequately preheat the gas in the lines before the lines pass the wafers. In this manner, the gas is able to absorb energy from the non-product region of the furnace with minimal or no cooling of the wafers in the product region of the furnace. Additionally, the lines are routed to absorb energy equally around the circumference of the process tube and not create a cold side within the tube. Also, the straight runs past the wafers are equally spaced around the circumference of the tube. In this way, any remaining effect of the gas lines on the tube are balanced.

30 Claims, 14 Drawing Sheets

PROCESS TUBE WITH IN-SITU GAS PREHEATING

CROSS REFERENCE TO RELATED APPLICATIONS

None

STATEMENT REGARDING FEDERALLY SPONSORED RESEARCH OR DEVELOPMENT

None

BACKGROUND OF THE INVENTION

Semiconductor wafer manufacturing employs furnaces in which silicon wafers are heated in the presence of a flowing gas. These furnaces are typically referred to as diffusion furnaces, although a number of operations, such as oxidation, chemical vapor deposition, and annealing, can be carried out within them. Batch type furnaces hold, typically, 50 to 200 wafers. During operation, the wafers are placed into a process chamber and heated to the appropriate temperature, generally from 400° C. to 1200° C. depending on the process. A process gas is run through the chamber. During furnace operation, the temperature and gas flow are varied to achieve the desired reaction at the wafer. These variations must be accurately controlled to obtain uniform and consistent results, both within single wafers and from wafer to wafer across the entire wafer load.

A typical furnace employs a cylindrical quartz process chamber, referred to as a process tube. An appropriate semiconductor grade quartz is used for the chamber, because this material can withstand the high temperatures involved and can maintain chemical purity within the chamber. One end is open to allow the wafer load to be inserted and removed. The other end typically contains ports within a distribution manifold for the injection of the process gas. An outlet port is located at the opposite end of the tube for discharge of the gas. The process tube is held in an insulated electrical heater. The heater has an open end for insertion of the process tube. Within the process tube, the wafers are held in a boat that sits on an end cap. The end cap thermally isolates the wafers from the open end of the heater and seals against the open end of the process tube.

Thermal uniformity of the process chamber requires that the electrical heater be controlled in a number of zones along its length. One or more of the zones lie within the region nearest the gas inlet and end before or near the beginning of the wafer load. This region, called the non-product region, heats the end cap area and reduces heat loss through the furnace end.

The process rate must be uniform across the entire wafer load for uniform and consistent results. Hence the wafers and the reactant gas should be at a uniform temperature throughout the process chamber. Because the reactant gas comes from facilities that are much cooler than the furnace, entry of the gas into the furnace can adversely affect the uniformity of the wafer load, if the gas is not preheated to the furnace temperature prior to entering the process chamber.

In a typical prior art approach shown in FIG. 22, the gas passes through delivery lines that run contiguously from an inlet port at one end of the process tube, along the length of the process tube to the distribution manifold at the opposite end. In this approach it is intended that the furnace preheat the gas in the delivery lines before the gas enters the process chamber. With this type of configuration, however, some thermal non-uniformity and wafer imperfections still occur.

BRIEF SUMMARY OF THE INVENTION

It has been observed that the above prior art process tube can lead to nonuniformities both within single wafers and from wafer to wafer. As the cold gas travels through the delivery lines, it absorbs energy from its surroundings. However, this absorption of energy also results in localized cooling of the wafers in the region closest to the delivery lines. The cooler parts of the wafer react differently than the warmer parts, leading to nonuniformity within a single wafer. See FIG. 21. Furthermore, as the gas flows along the tube through the delivery lines, it draws more energy from the tube closer to the inlet where the gas is cooler and less energy further along the tube where the gas is warmer, leading to temperature differentials within the process chamber. Thus, different process rates may occur in different parts of the tube, leading to nonuniformity from wafer to wafer. At higher flow rates, the gas absorbs more energy and these problems become more significant.

The present invention provides a process tube which mitigates these problems. In this tube, the gas delivery lines are shaped to wind back and forth around the circumference of the process tube near its open end. The axial extent of this winding section begins near the open end of the tube and terminates some distance away from the beginning of the wafer load region. From the termination of the winding section, the lines continue axially directly up to the top of the tube. The length of the lines within the winding section is preselected to adequately preheat the gas in the lines before the lines extend past the wafer product. In this manner, the gas is able to absorb energy solely from the lower part of the furnace without causing cooling of the wafer product.

Additionally, the lines are routed to absorb energy equally around the circumference of the non-product region of the chamber and not create a cold side of the furnace. Thus, when two or more lines are used, they have the same length and are wound to provide the same absorption of energy. Also, the straight runs along side of the wafer product area are equally spaced around the circumference of the tube. Thus, two lines are located 180° apart, four lines are located 90° apart, and so on. In this way, any remaining effect of the gas lines on the tube are balanced.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
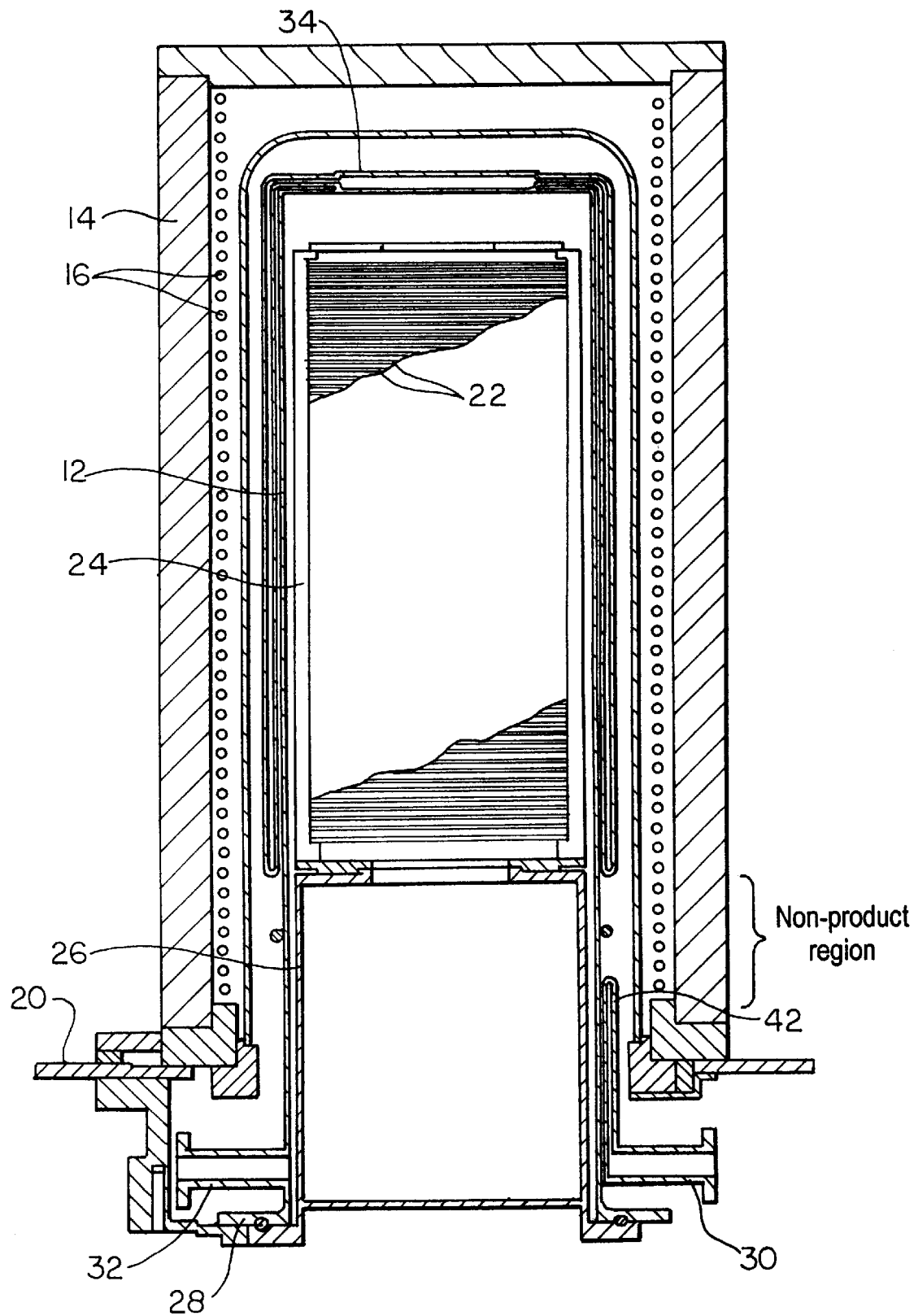
FIG. 1 is a cross sectional view of a process tube according to the present invention.
Figure 4:
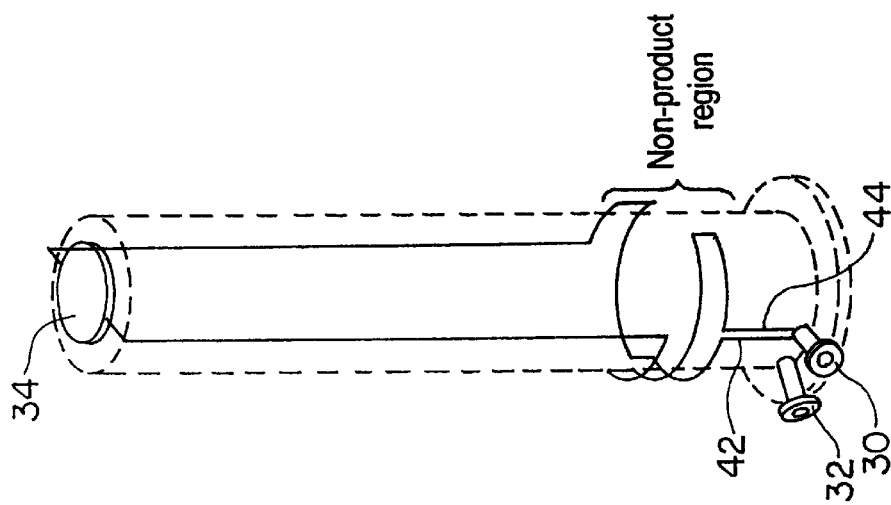
FIGS. 2, 3 and 4 are schematic isometric views of the process tube of FIG. 1 illustrating the winding of the gas delivery lines.
Figure 3:
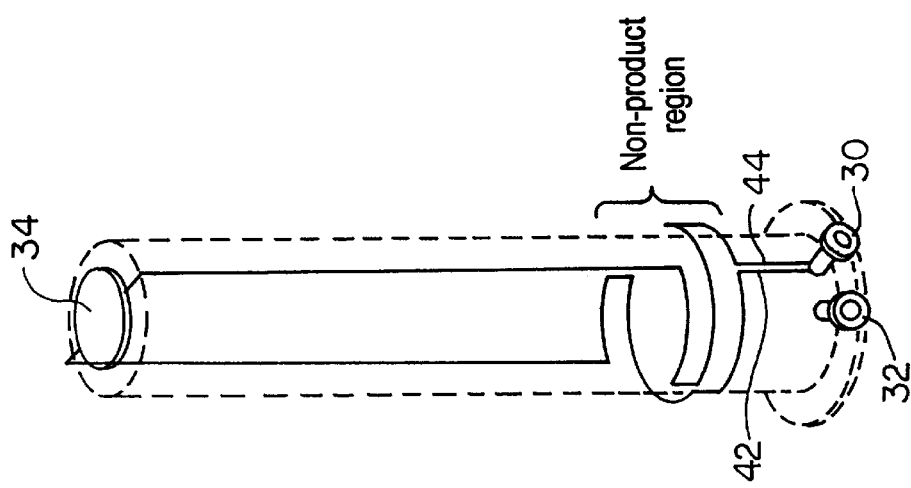
Figure 2:
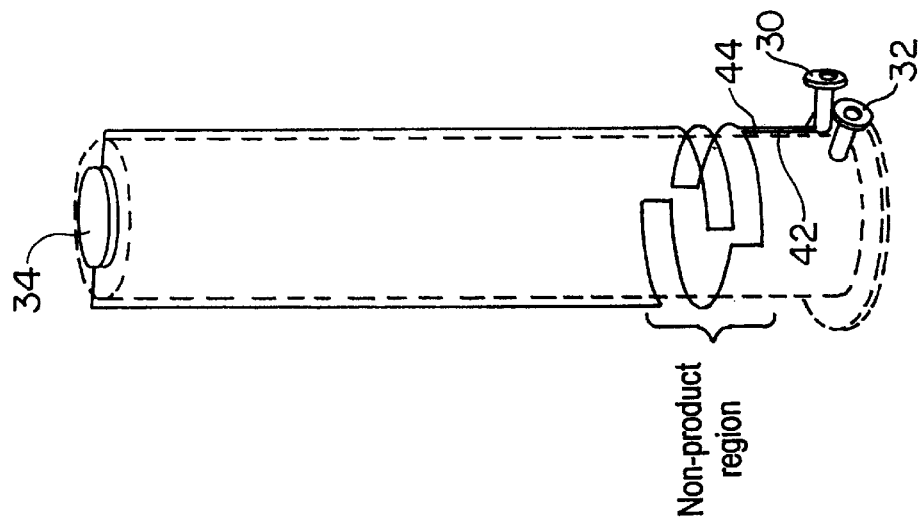

A process tube 12 according to the present invention is illustrated in FIG. 1 with a batch load of wafers contained therein. The process tube is held within a heater comprising an insulated outer housing 14 and a number of heating elements 16 which circumferentially or spirally surround the process tube. The heater may be supported in any conventional manner, such as on a heater support plate 20. Suitable heater control elements (not shown) may be provided, as known in the art.

Figure 5:
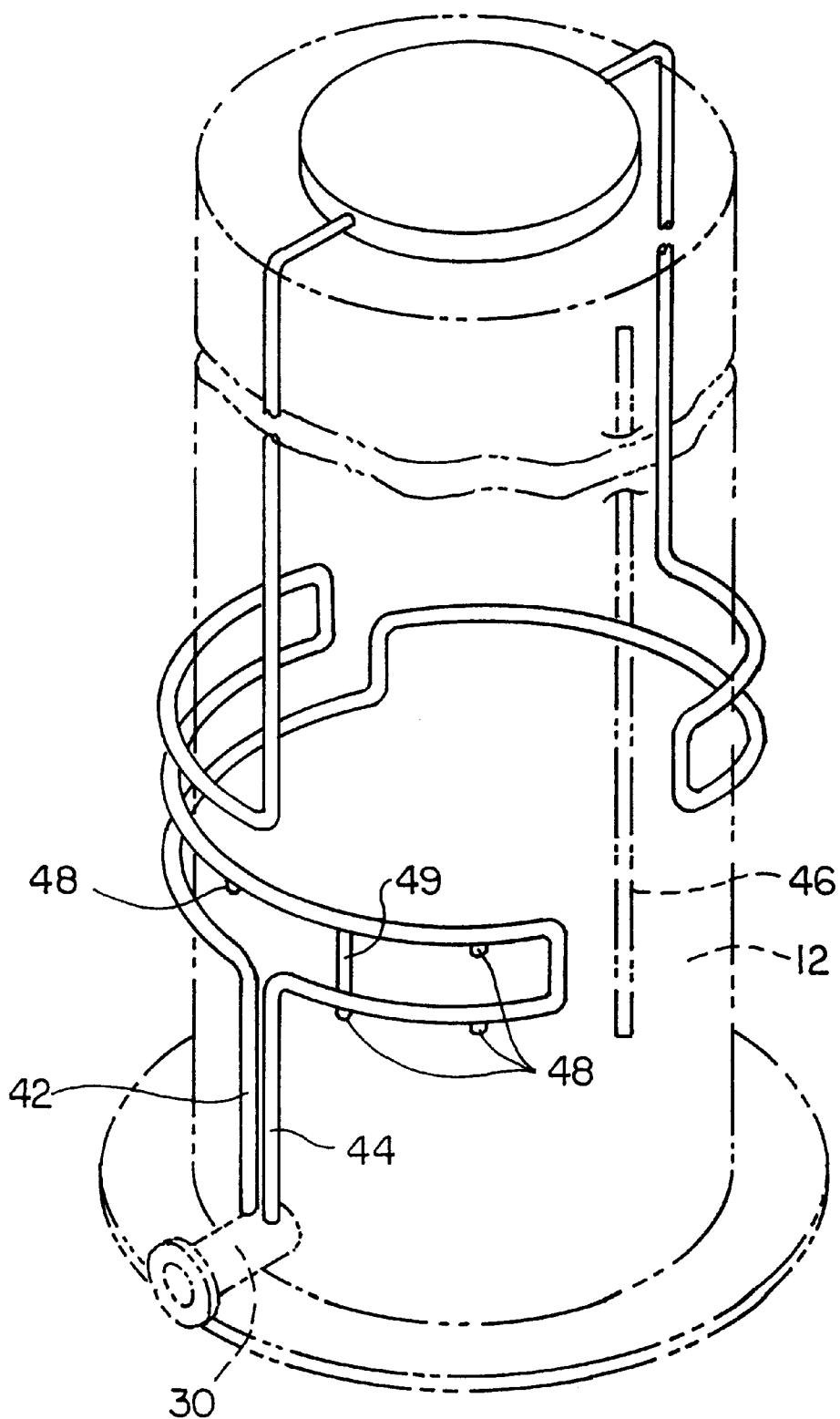
FIG. 5 is a further schematic isometric view of the process tube of FIG. 1.

Semiconductor wafers 22 are stacked axially in a boat 24 that sits on an end cap 26 within the process tube 12. The end cap seals the open lower end 28 of the process tube with suitable sealing members such as an O-ring. The end cap also extends within the non-product region of the heater, thereby thermally isolating the wafers in the boat 26 from the open end of the heater. In some process tube designs, a profile thermocouple 46 for furnace control (shown schematically by dashed lines in FIG. 5) runs the length of the process tube, although this thermocouple may be placed in other locations in other furnace designs.

An inlet port 30 for gas delivery lines is provided in the region of the end cap 26. An outlet port 32 in communication with the chamber within the process tube 12 is also provided in the region of the end cap. A distribution manifold 34 is provided at the top of the process tube for admitting gas into the chamber within the tube.

Referring more particularly to FIGS. 2 through 6, in the preferred embodiment, a pair of gas delivery lines 42, 44 extend from the inlet port 30 contiguously an axial distance until they enter the non-product region, which is generally the region of the heater adjacent to the upper part of the end cap and below the first wafer in the boat. Within the non-product region, the lines diverge and wrap around the process tube in a number of lateral and axial segments. Because of the presence of the thermocouple 46, the lines cannot extend completely around the circumference of the tube in which this thermocouple is present. The axial section of the tube in which the thermocouple is located is described as a keep-away region, indicated by the letter C in FIG. 6.

Preferably, the first or lower lateral segments 50a, 50b (FIG. 6) of the lines diverge laterally at an axial distance A above the lowest portion of the heater to ensure that the lines get heated. Also, the final or uppermost lateral segments 52a, 52b of the lines terminate an axial distance B below the first wafer in the boat to ensure that the gas reaches the desired temperature prior to passing the wafers.

The delivery lines 42, 44 are formed of semiconductor grade quartz, preferably identical to the quartz forming the process tube. The lines are attached to the outside surface of the tube by suitable bridge welds 48 of quartz material at spaced locations along the length of each line so that differential thermal expansion does not cause breakage. Also, to prevent or minimize sagging of the lines over time, a number of additional supports 49 may be provided between lateral segments. For clarity, only a few bridge welds 48 and a single support 49 have been illustrated in FIG. 5.

The pressure drop in the gas delivery lines 42, 44 must be similar to that of a standard process tube, or a higher inlet pressure would be required, which might exceed the pressure limits of the seals connecting the gas lines from the furnace to the process tube. Thus, the length of the lines, the inner diameter of the lines, and the radius of the bends between lateral and axial segments are selected to minimize the pressure drop. The exterior diameter of the lines is selected to maintain structural integrity at high temperatures.

To heat the gas within each line 42, 44 to the same temperature, the length of each line within the non-product region is substantially the same. This length is preselected to heat the gas in the line to the desired temperature prior to passing axially the remaining length of the process tube to the distribution manifold at the top. The desired goal is to heat a predetermined flow of process gas to at least 90% of the process temperature before passing the first wafer.

Figure 20:
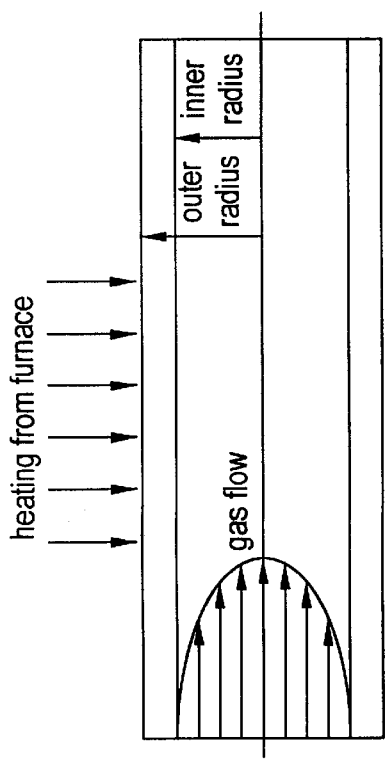
FIG. 20 is a schematic illustration of heat transfer through a tube wall.
Figure 21:
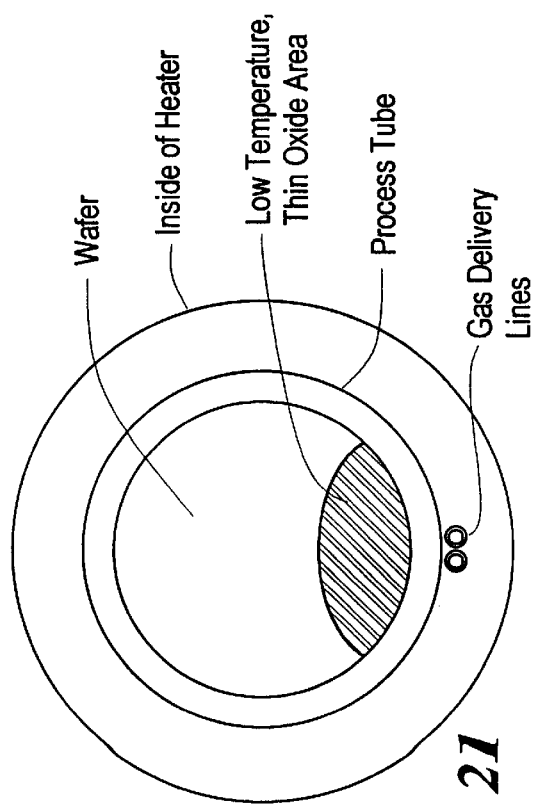
FIG. 21 is a schematic top view of a wafer illustrating localized cooling.

The length of the lines to achieve this goal can be calculated using known heat transfer principles. By assuming one-dimensional heat transfer from the furnace through the tube wall to the gas (see FIG. 20), a simple model can be developed.

Define:

q=heat transfer per unit length, i.e. Watts/meter.
T=temperature
r=radius of tube and

| Subscript | refers to or describes |
|---|---|
| g | mean property of gas in tube |
| f | furnace |
| i | inside surface of tube |
| o | outside surface of tube |

The following equations apply:

a) Heat transfer from the inside of the tube to the gas:

$$q=2\pi r_i h^*(T_i-T_g), \quad (1)$$

where h is the film coefficient.

b) Heat transfer from the outside of the tube to the inside:

$$q=2\pi k^*(T_o-T_i)/ln(r_o/r_i) \quad (2)$$

where k is the thermal conductivity of the tube.

c) Heat transfer from the furnace to the outside of the tube:

$$q=2\pi r_o \epsilon \sigma^*(T_f^4-T_o^4), \quad (3)$$

where it has been assumed that radiation is the primary mechanism for energy transport to the tube. $\sigma$ is the Stefan-Boltzmann constant, and $\epsilon$ is the effective emissivity.

d) Temperature rise of the gas:

$$mc(dT_g/dx)=q, \quad (4)$$

where m is the gas mass flow rate (Kg/sec), and c is the specific heat of the gas (J/Kg° C.).

Equations 1 and 2 can be combined to eliminate $T_i$, with the result:

$$q=U*(T_o-T_g),$$

and $$U=(1/(2\pi r_i h)+ln(r_o/r_i)/(2\pi k))^{-1} \quad (5)$$

Since the furnace temperature is known as a function of distance from the gas inlet, the following algorithm can be used to solve for the gas temperature $T_g$.

Step 1: Start at the beginning of the tube with the gas inlet temperature for $T_g$.

Step 2: Use equations 3 and 5 to eliminate $T_o$ and predict q in terms of known $T_f$ and $T_g$. Because equation 3 is non linear, this can be done in practice using Newton-Raphson iteration.

Step 3: Using the q calculated from step 2, integrate equation 4 a distance δx. This then gives a new $T_g$ at the new x location. Equation 4 is an initial value problem and the integration can be done numerically using a scheme such as Euler's method or Runge-Kutta.

Step 4: Use the results of step 3 and return to step 2. Repeat the loop until at the end of the tube.

To absorb energy symmetrically from the heater to prevent formation of a hot side and a cold side of the furnace and to keep the pressure drop substantially the same in each line, the transitions or bends between the axial and lateral segments occur at generally the same distance along each line and the same number and lengths of lateral and axial segments are provided. Additionally, to absorb energy symmetrically from the heater, the lines extend along the region of the wafers on opposite sides of the process tube.

Figure 6:
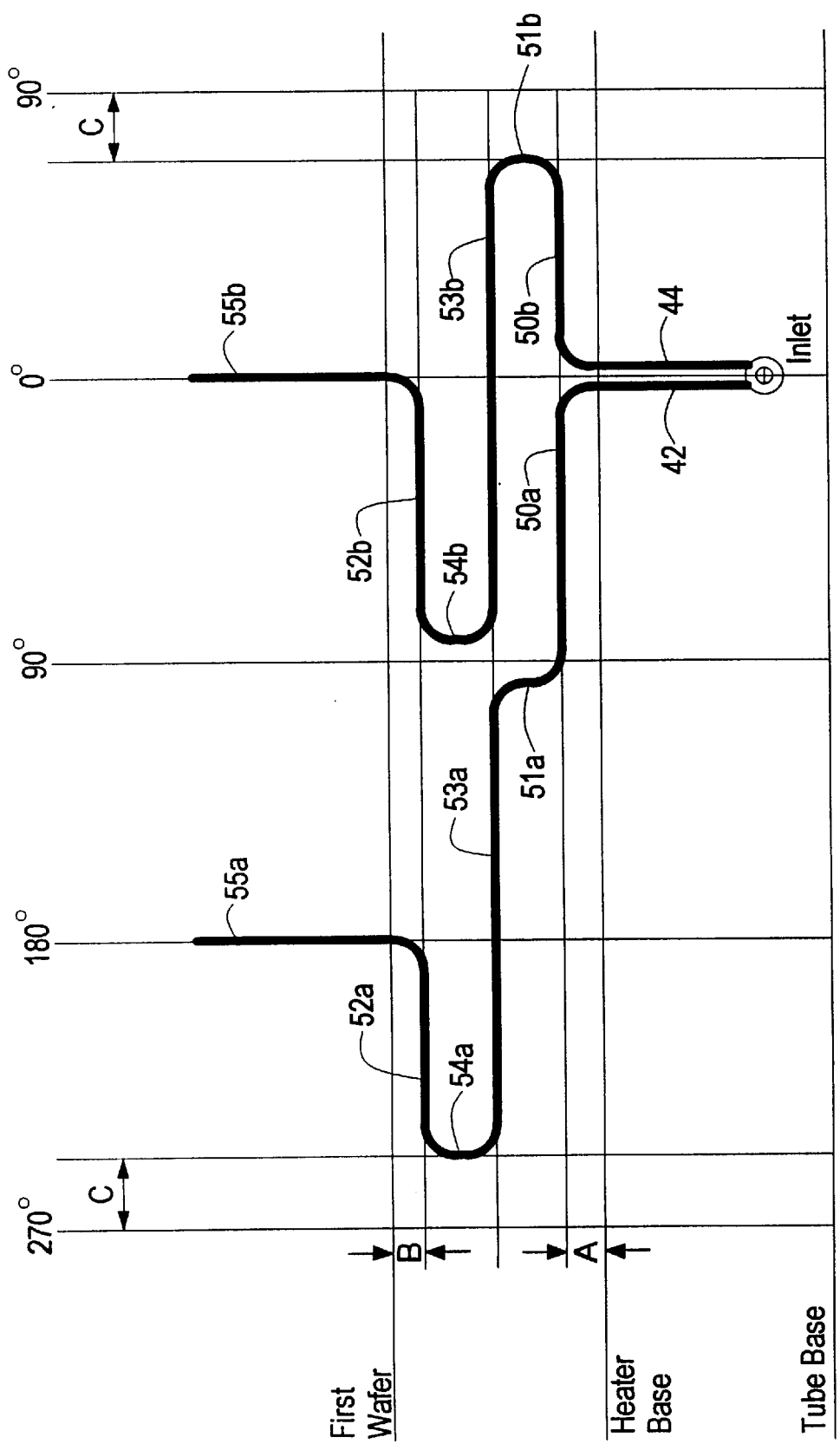
FIG. 6 is a schematic illustration of a preferred embodiment of two delivery lines in a "flattened out" configuration.

A preferred embodiment of a configuration of windings for the pair of delivery lines 42, 44 around a process tube having a keep-away region C is shown in FIG. 6. In this figure, the lines 42, 44 are shown "flattened out," as if the process tube were split axially in the keep-away region and unrolled. The location of the bends in the lines with respect to the circumference of the tube are indicated with reference to the longitudinal lines of 0° at the inlet, 90° toward the right, and 90°, 180°, and 270° toward the left. The region C indicates the keep-away region.

Thus, the first lateral segment 50b of the right line 44 extends circumferentially to the right around the process tube until it reaches the keep-away region C. At this location, the right line bends in a U or hair pin shape to form a short axial segment 51b and then continues in a second lateral segment 53b back in the opposite direction until it reaches approximately 90° to the left. At this location, the line bends again in a U or hair pin shape to form another short axial segment 54b and then continues in another lateral segment 52b until it reaches the 0° line. Here, the line bends to form an axial segment 55b which extends into the region of the heater containing the wafers and continues axially to the end of the process tube where it joins the distribution manifold 34.

The first lateral segment 50a of the left line 42 extends circumferentially to the left around to the process tube until it reaches the 90° line. At this location, the line 42 bends to form a short axial segment 51a having a length equal to the axial length of the right line segment 51b. The left line then bends again to form a lateral segment 53a which continues in the same direction toward the left until it reaches the other side of the keep-away region C. At this location, the left line bends in a U or hair pin shape to form another short axial segment 54a, whose length is again equal to the axial length of the right line segment 54b, and then continues in a lateral segment 52a back in the opposite direction, toward the right in FIG. 6. At the 180° location, the left line bends to form an axial segment 55a which extends into the region of the heater containing the wafers and continues axially to the top of the process tube until it joins the distribution manifold 34.

Figure 7:
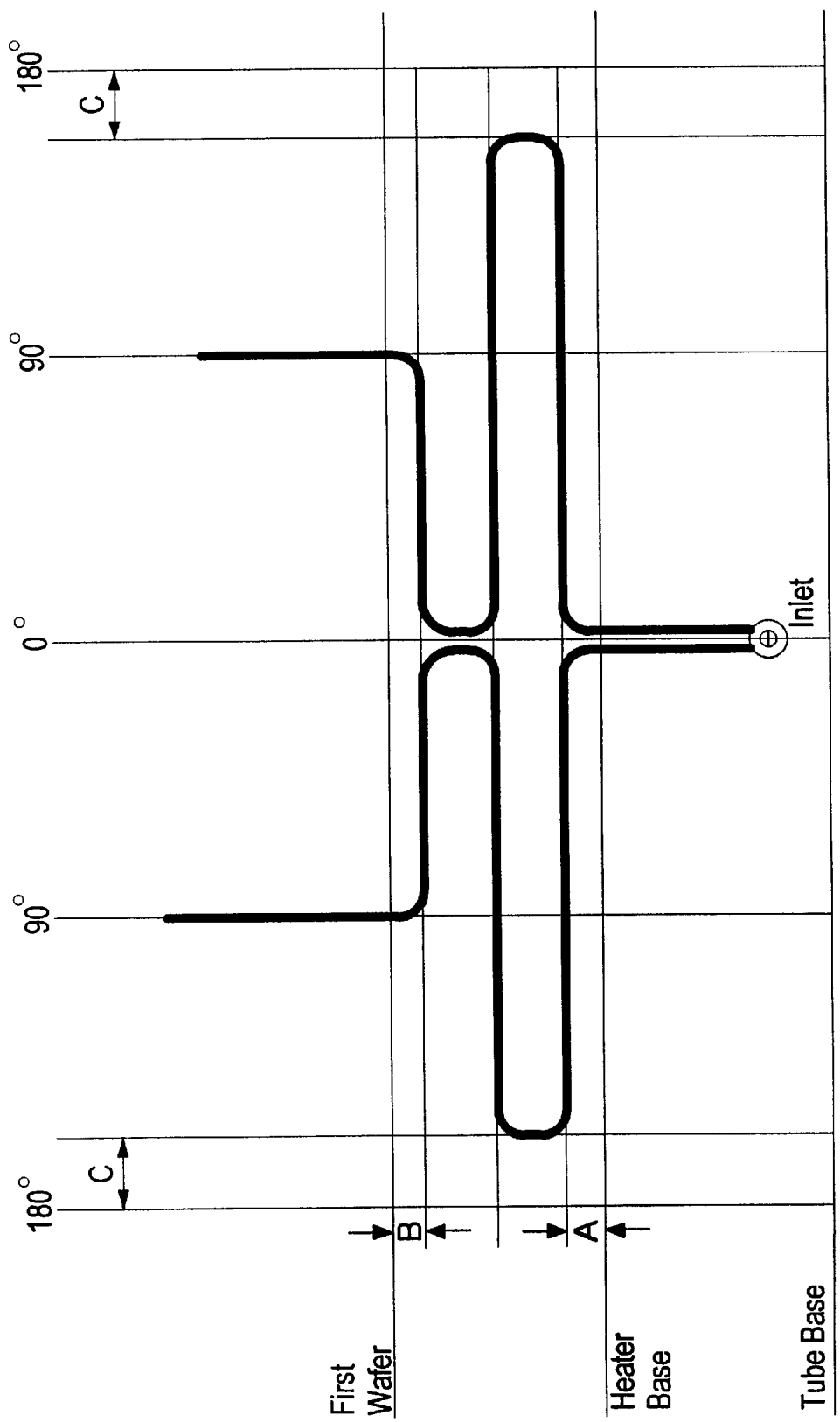
FIG. 7 is a schematic illustration of a further embodiment of two delivery lines in a "flattened out" configuration.
Figure 8:
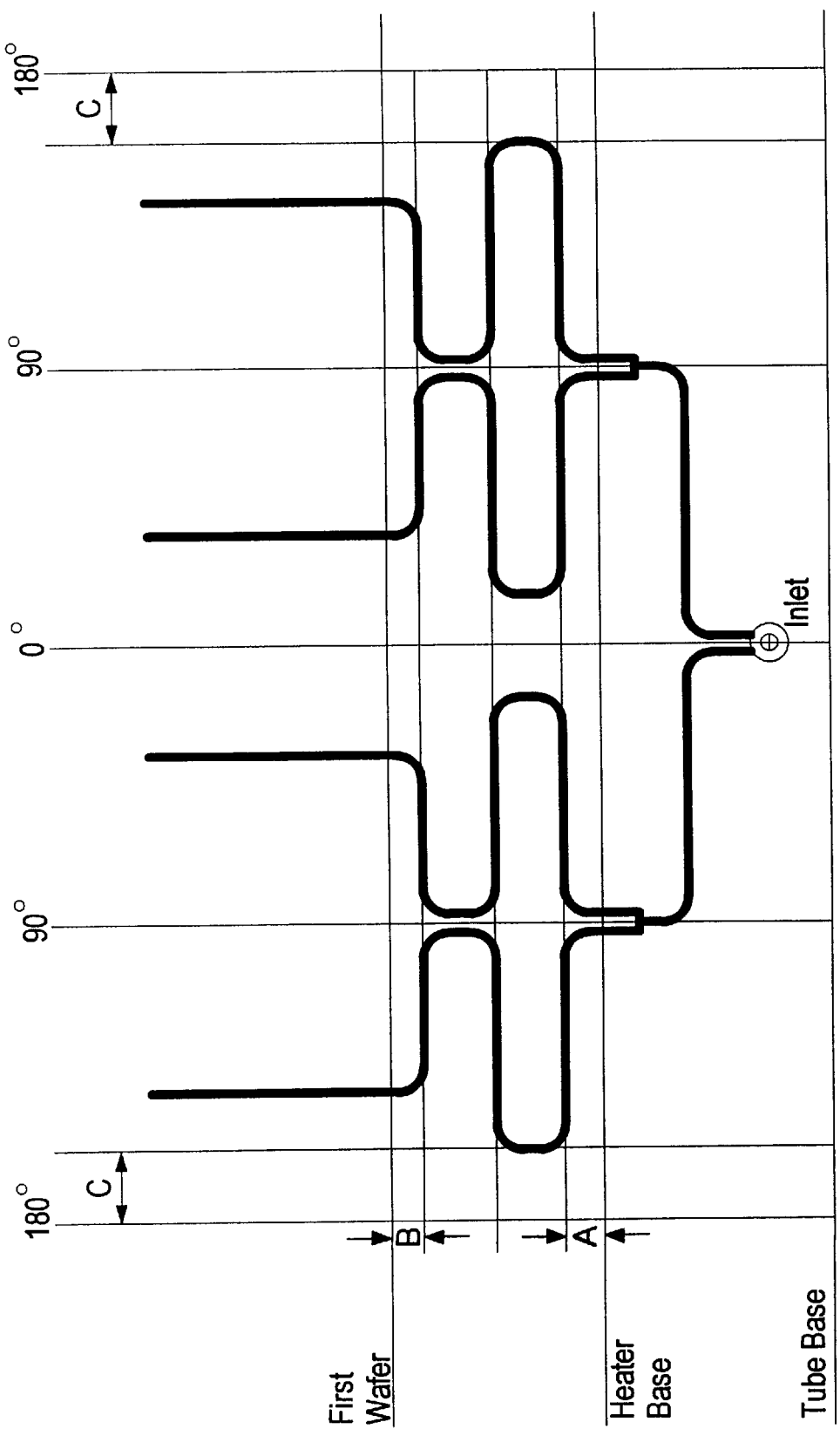
FIG. 8 is a schematic illustration of an embodiment of four delivery lines in a "flattened out" configuration.
Figure 9:
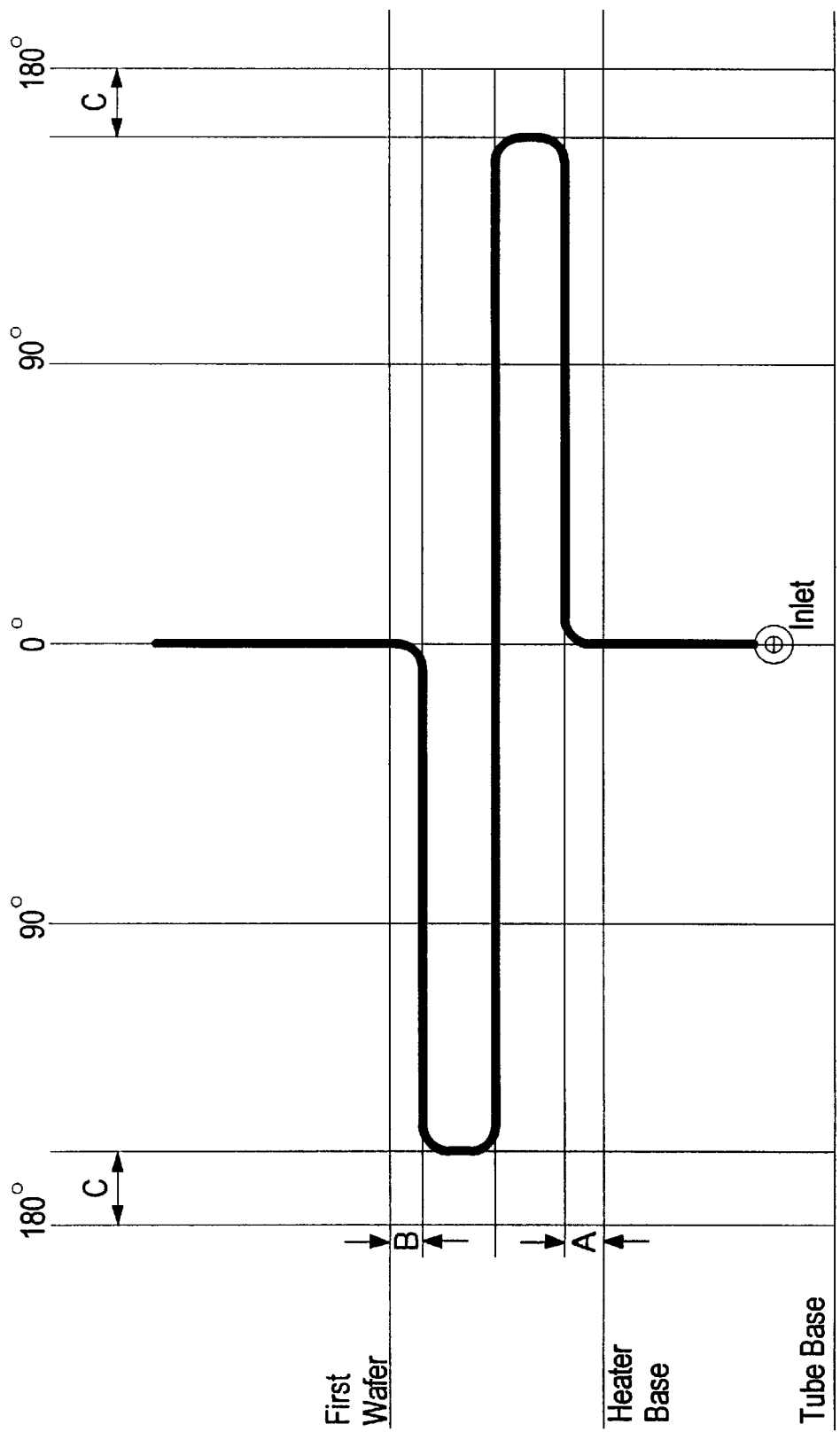
FIG. 9 is a schematic illustration of an embodiment of a single delivery line in a "flattened out" configuration.
Figure 10:
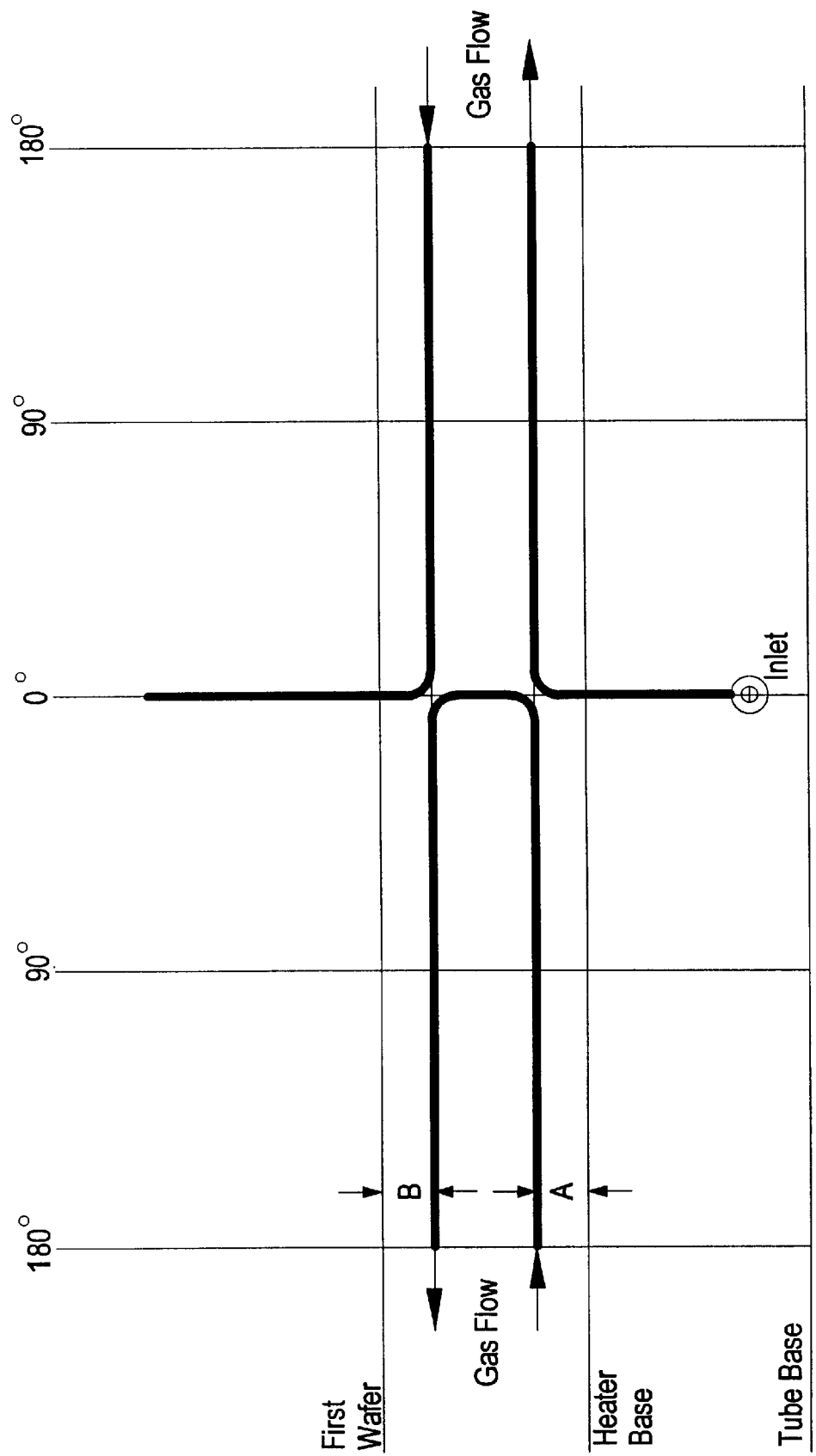
FIG. 10 is a schematic illustration of a further embodiment of a single delivery line in a "flattened out" configuration.
Figure 11:
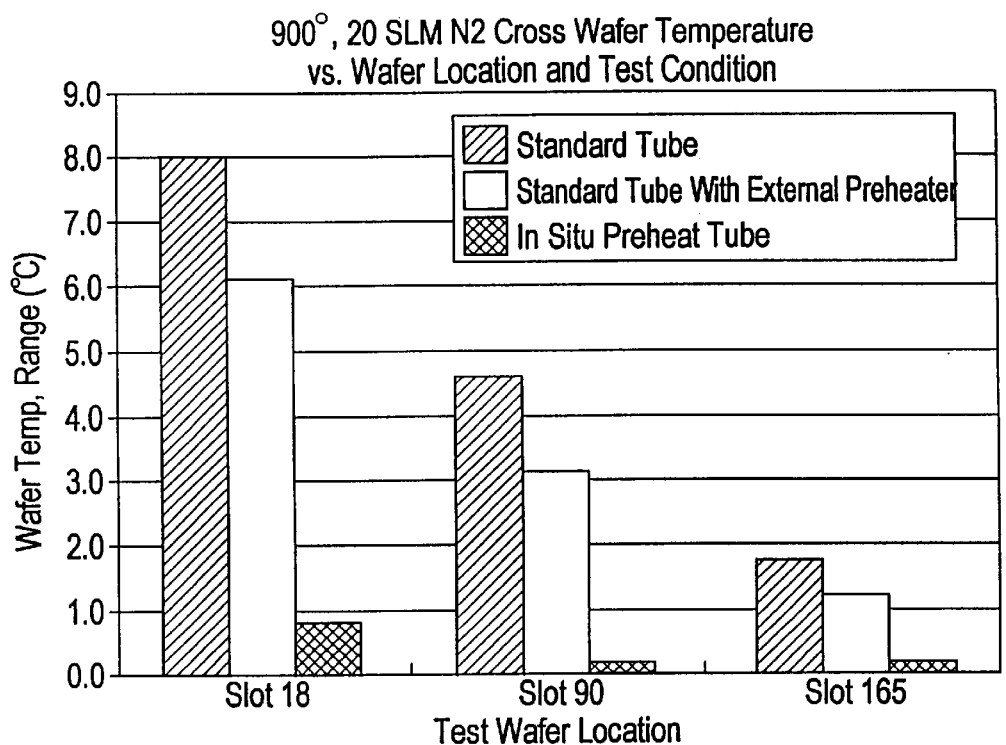
FIGS. 11 through 15 are bar graphs illustrating temperature differentials across single wafers obtained in tests comparing the present invention to standard process tubes and external preheating of the gas.
Figure 12:
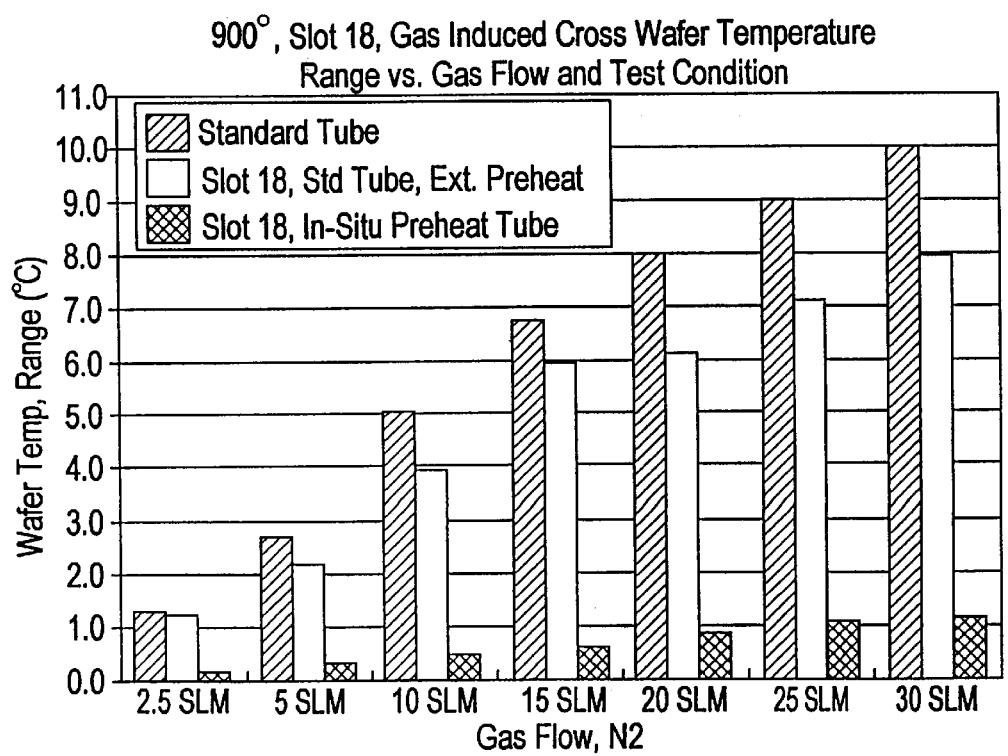
Figure 13:
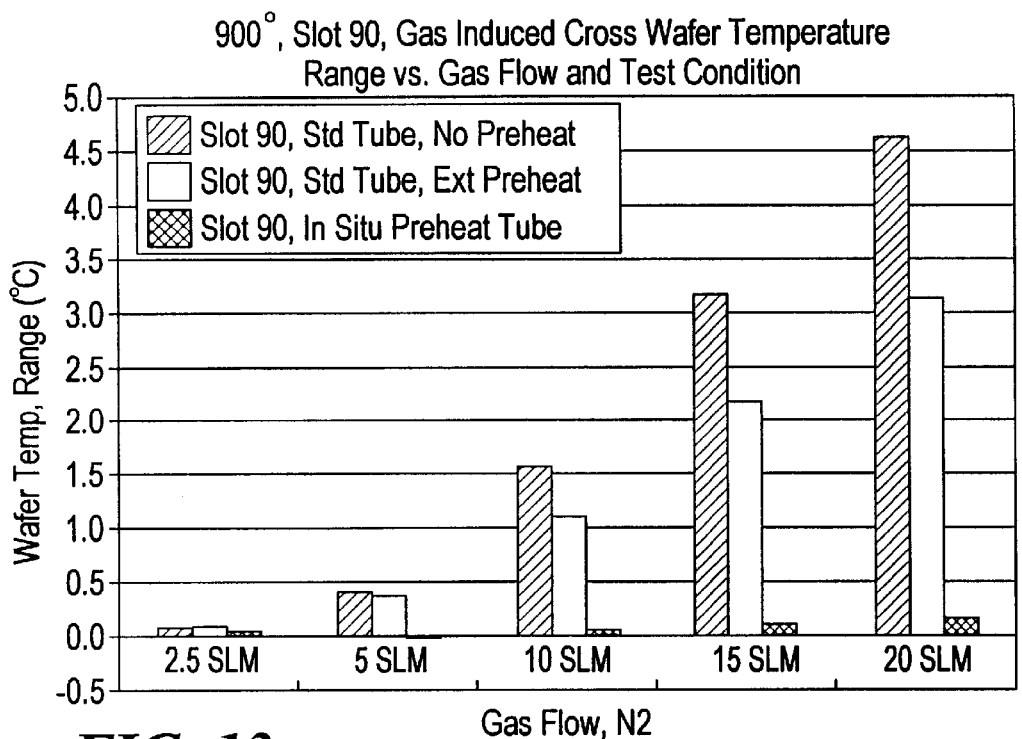
Figure 14:
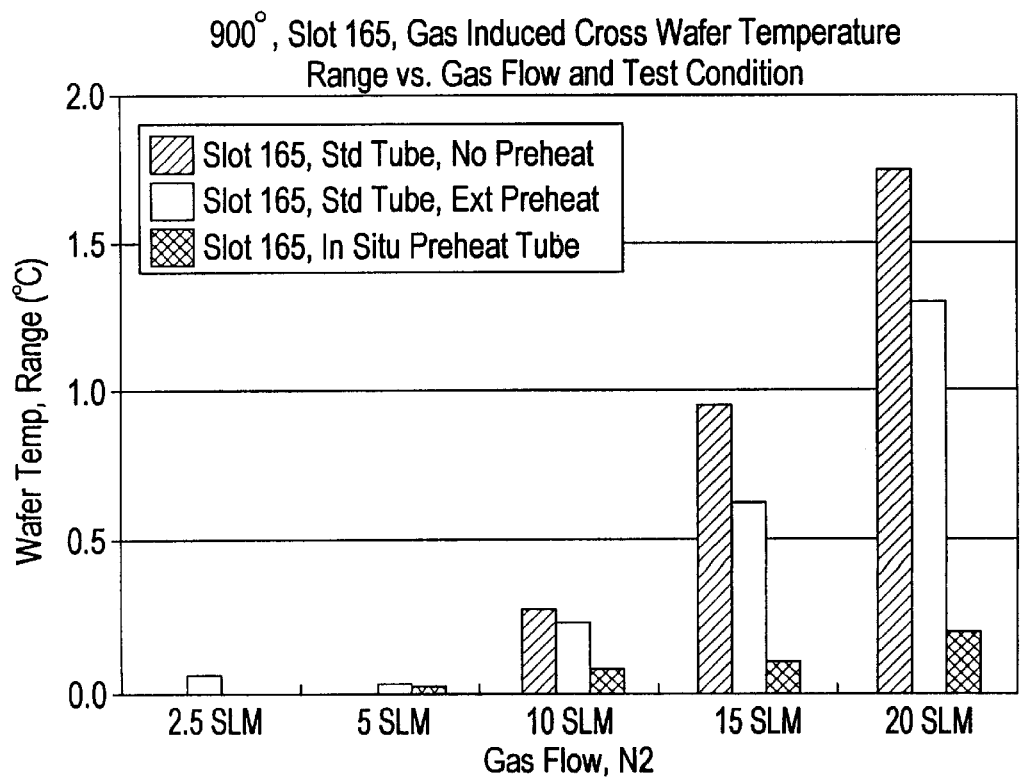
Figure 15:
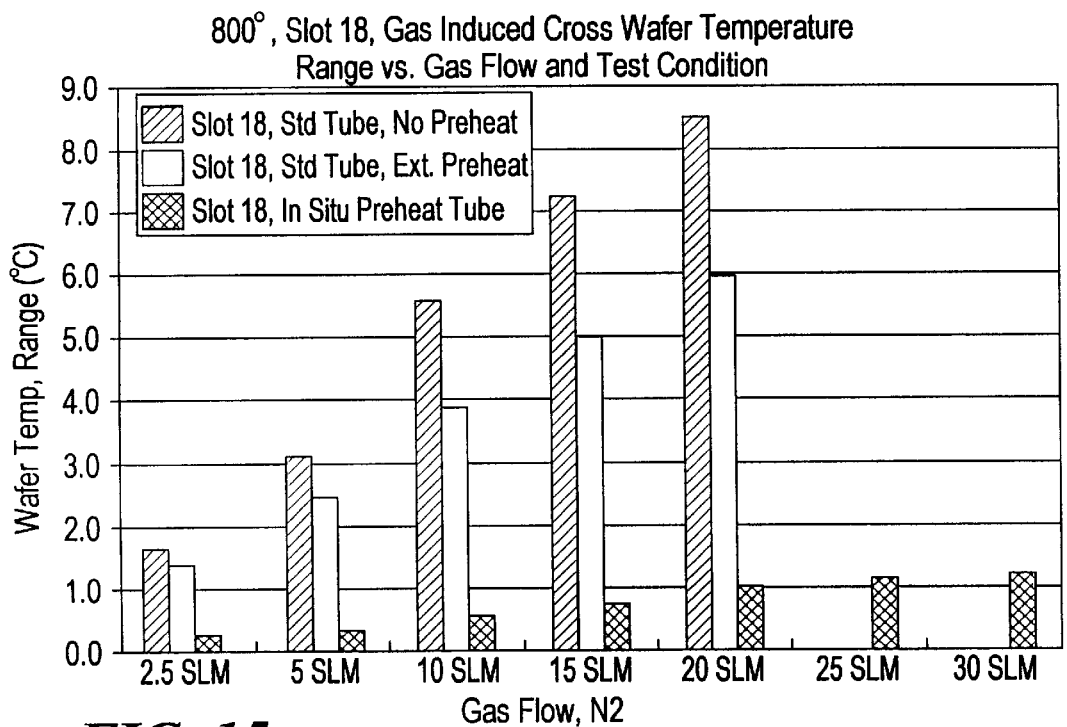

An alternate embodiment of a design using two delivery lines wrapped around a tube with a keep-away region is illustrated in FIG. 7. FIG. 8 illustrates a design incorporating four delivery lines. With a greater number of delivery lines, each line can be made shorter to achieve a desired temperature. FIG. 9 illustrates a design using a single delivery line wrapped around a process tube having a keep-away region. FIG. 10 illustrates a further embodiment using a single delivery tube wrapped around a process tube which does not have a keep-away region. A drawback to using only a single tube as shown in FIGS. 9 and 10 is that the energy cannot be removed as symmetrically (equally from opposite sides of the process tube) as with a multiple tube design. Under high gas flow rates, this may result in some thermal imbalance in the region closest to the gas inlet. Each of FIGS. 7 through 10 is similar to FIG. 6 in that they illustrate the delivery lines in a "flattened out" configuration.

Figure 22:
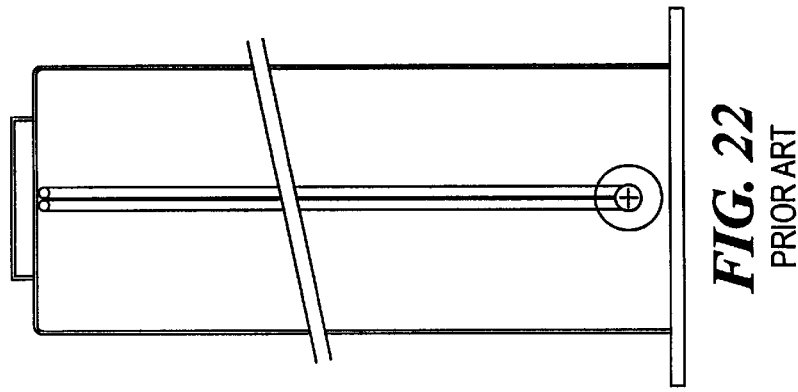
FIG. 22 is a schematic view of a prior art process tube.

The invention was tested and compared to a standard process tube with straight delivery lines as shown in FIG. 22 and to a design which preheated the gas externally of the furnace. In the external preheating design, process gas was heated outside of the furnace and introduced into delivery lines that ran straight up the side of the tube as shown in FIG. 22. With external preheating, the temperature at the inlet to the delivery lines was approximately 400° C.

In the tests, test wafers having thermocouples located at selected positions near the periphery and in the center of the wafer were loaded into a wafer boat at slots 18 (near the non-product region), 90, and 165, (near the distribution manifold). Tests were run at 800° C. and 900° C. for a variety of gas flow rates, and the temperatures of the test wafers at the selected positions were recorded.

FIGS. 11 through 15 are bar graphs of the gas-induced temperature differentials within each wafer for each of the runs. The solid dark bars represent the temperature differentials using the standard tube; the white bars represent the temperature differentials using external preheating; and the shaded bars represent the temperature differentials using the present invention (described as "in-situ preheat tube" on the graphs).

As can be seen from these graphs, the present invention resulted in the least temperature differentials within the wafers. Additionally, at greater gas flow rates, the temperature differentials increased considerably in the standard tube and using external preheating. However, the temperature differentials did not significantly increase using the present invention. Thus, these results indicate improved within-wafer uniformity.

Figure 16:
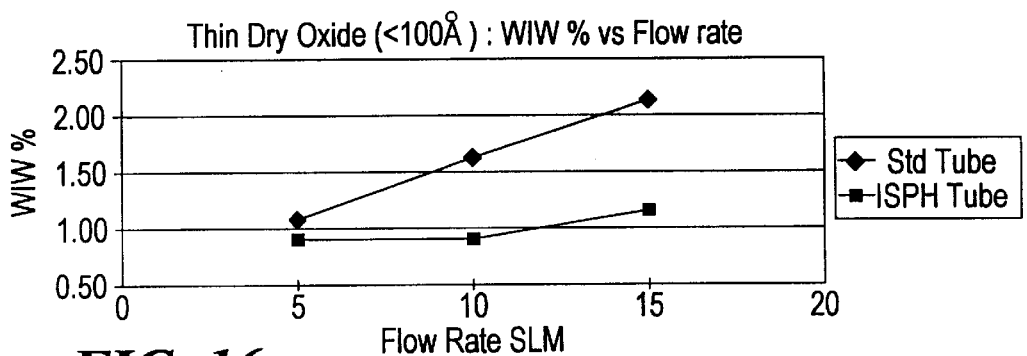
FIGS. 16 and 17 are graphs illustrating within-wafer oxide thickness variation after processing using a standard process tube and the process tube of the present invention.
Figure 17:
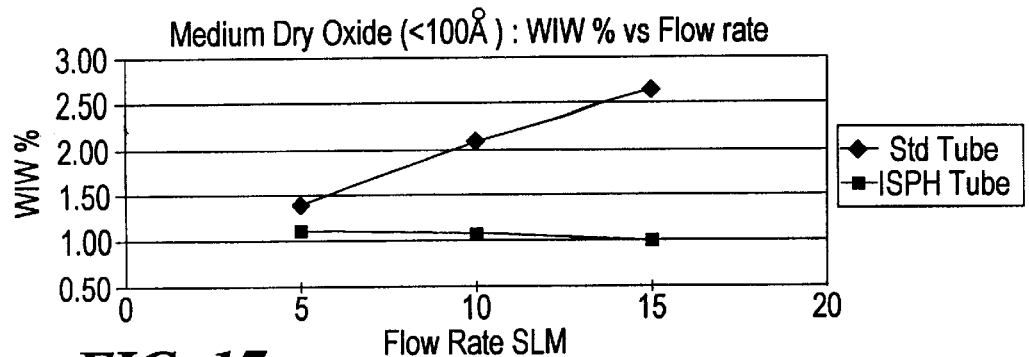

FIGS. 16 and 17 illustrate tests in which wafers were processed using two thin oxide recipes, less than 100 Å (thin) dry oxide and greater than 100 Å (medium thickness) dry oxide, in a standard process tube and in a process tube according to the present invention. Ten test wafers were placed in the tubes and the resulting oxide film thicknesses were measured. The graphs plot the range of within-wafer oxide film thickness as a percentage of the mean thickness for flow rates of 5 SLM, 10 SLM, and 15 SLM. The graphs show a greater variation in oxide thickness using the standard tube. Also, the variation increased significantly for increasing flow rates. The increasing variation with increasing flow rates was considerably less significant using the process tube according to the present invention.

Figure 18:
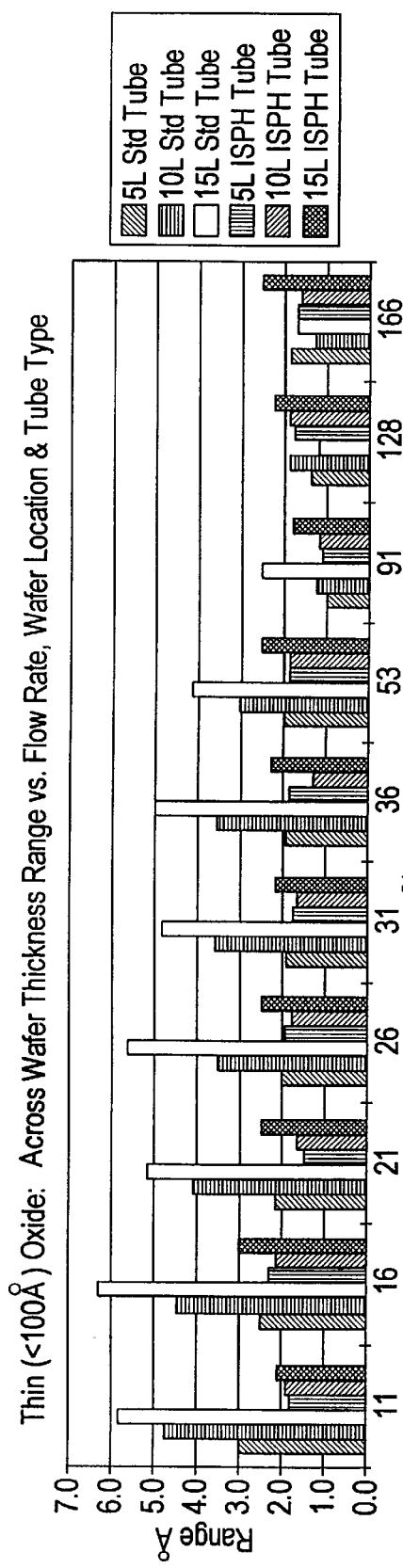
FIGS. 18 and 19 are bar graphs illustrating across-wafer oxide thickness variation after processing using a standard process tube and the process tube of the present invention.
Figure 19:
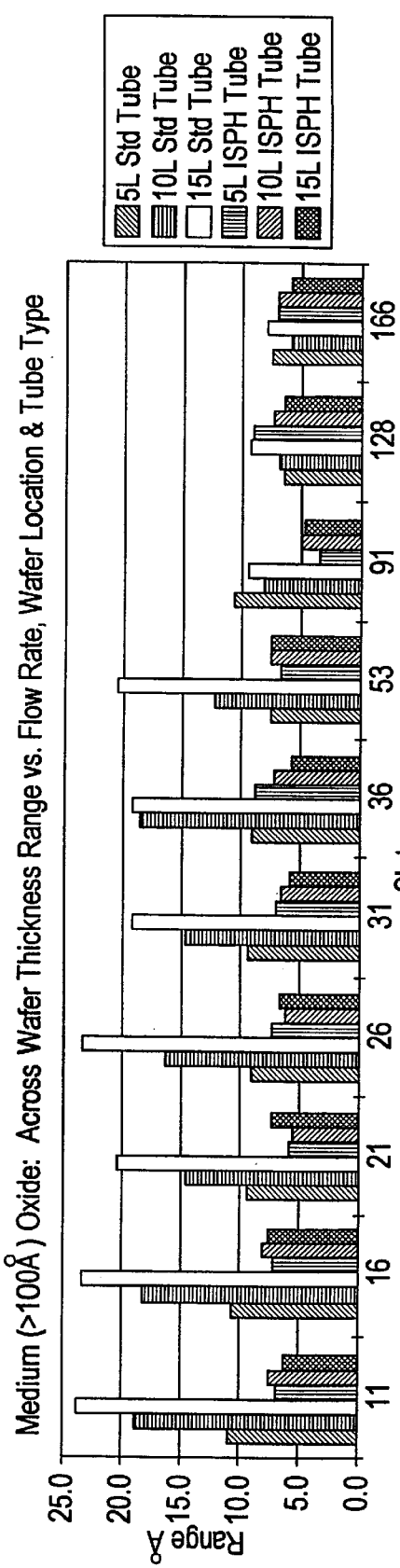

FIGS. 18 and 19 illustrate the range of oxide film thicknesses in Angstroms for wafers positioned in slots 11 (nearest the non-product region), 16, 21, 26, 31, 36, 53, 91, 128, and 166 (nearest the distribution manifold) within a standard process tube and a process tube of the present invention. The range is the difference between the least and greatest measured thickness within each wafer. For each slot, six bars are shown: the first three bars are with a standard process tube at flow rates of 5 SLM, 10 SLM, and 15 SLM respectively, and the last three bars are with a process tube according to the present invention also at flow rates 5 SLM, 10 SLM, and 15 SLM respectively. As can be seen, the present invention results in smaller thickness ranges than the standard process tube and less variation between wafers in different slots. Thus, these results indicated improved within-wafer and wafer to wafer uniformity.

Figure 24:
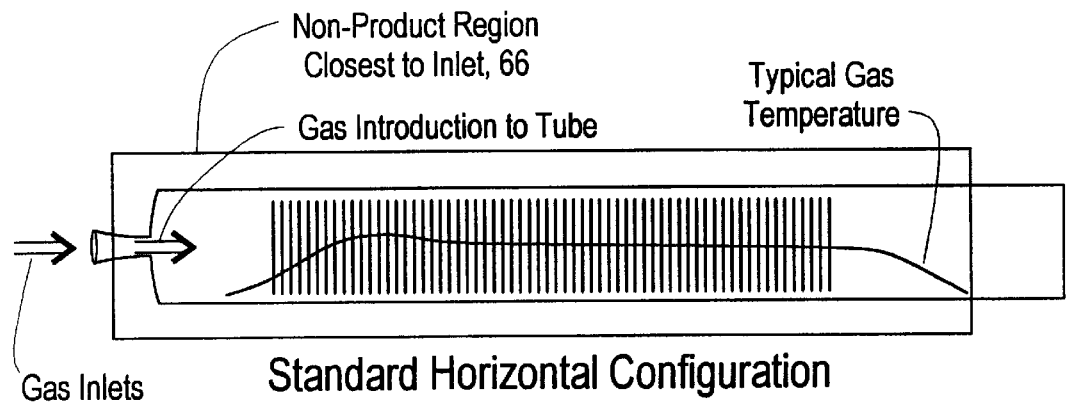
FIG. 24 is a schematic side view of a prior art horizontal process tube.

Although the preferred embodiment has been described above in conjunction with a vertical furnace, the preheating lines can be utilized with horizontal furnaces also. A prior art horizontal furnace configuration is illustrated schematically in FIG. 24. As can be seen, process gas is introduced into the tube through an inlet at one end and flows over the wafers toward the other end of the tube. In this configuration, the gas temperature is cooler near the inlet end.

Figure 23:
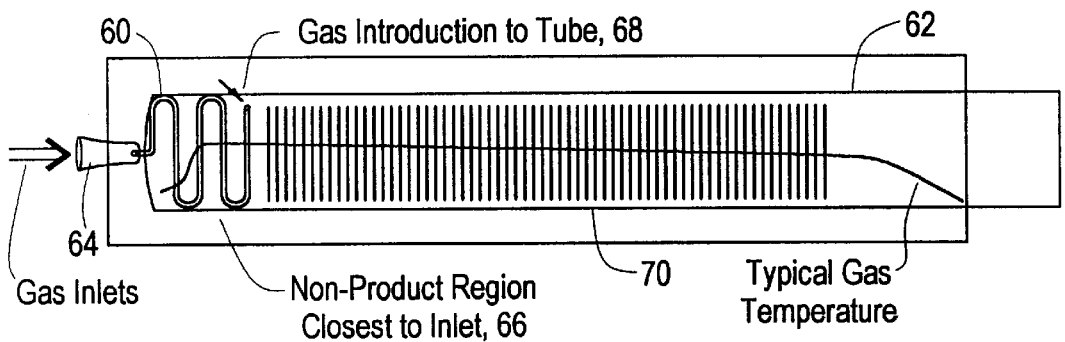
FIG. 23 is a schematic side view of a horizontal process tube according to the present invention.

In the horizontal configuration according to the present invention, illustrated in FIG. 23, one or more distribution lines 60 extend from the inlet 64 of the process tube 62 around the outer periphery of the process tube in a winding configuration through the non-product region 66. The lines terminate at a gas distribution inlet 68 in the side wall of the process tube near the beginning of the product region 70. As discussed above, the lengths and configurations of the distribution lines are preselected to heat the gas to the desired temperature with minimal pressure drop and thermal imbalance. It will be appreciated that, although only one delivery line is illustrated in FIG. 23, multiple symmetrically arranged lines can be used, as discussed above. Similarly, the winding configuration of the line is indicated merely schematically in FIG. 23; the actual configuration can be determined as discussed above.

The invention is not to be limited by what has been particularly shown and described, except as indicated by the appended claims.

We claim:

1. A furnace for processing product with a heated gas, comprising:
   an insulated housing;
   a process tube disposed within the housing and having opposed first and second ends, the process tube defining a process chamber therein for receiving product;
   a product support member disposed within the process tube;
   a heating element disposed within the insulated housing to surround the process tube, a portion of the heating element lying in a first region between the product support member in the process tube and one of the opposed first and second ends;
   a gas distribution inlet in the process tube to direct a gas into the process chamber;
   a gas output port in the process tube to remove gas from the process chamber;
   a gas input port disposed near the first end of the process tube;
   at least one gas delivery line disposed between the gas input port and the gas distribution inlet, and comprising a first portion wrapped at least partially circumferentially about a portion of the process tube in the first region, the length of the first portion being preselected to preheat gas in the gas delivery line to a predetermined temperature prior to the gas reaching a product region of the process chamber.

2. The furnace of lclaim 1, wherein the at least one gas delivery line further comprises a second portion extending axially along the process tube in a second region adjacent the product support member between the first portion and the gas distribution inlet.

3. The furnace of claim 1, further comprising a further gas delivery line disposed between the gas input port and the gas distribution inlet, and comprising a further first portion wrapped at least partially circumferentially around the process tube in the first region, a length of the further gas delivery line being substantially equal to a length of the gas delivery line.

4. The furnace of claim 3, wherein the further gas delivery line comprises a further second portion extending axially along the process tube in a second region adjacent the product support member between the further first portion and the gas distribution inlet.

5. The furnace of claim 3, wherein the gas delivery line and the further gas delivery line extend contiguously for a distance between the gas inlet port and the first portion and further first portion respectively.

6. The furnace of claim 3, wherein the gas delivery line and the further gas delivery line comprise a second portion and a further second portion respectively extending axially along the process tube in a second region adjacent the product support member from the first portion and the further first portion respectively to the gas distribution inlet, the second portion of the gas delivery line and the further second portion of the further gas delivery line being equidistantly spaced about the circumference of the process tube.

7. The furnace of claim 3, wherein the first portion of the first gas delivery line and the further first portion of the further gas delivery line comprise an equal number of lateral and axial segments, each segment having substantially equal lengths and occurring at generally identical locations along the first and further first portions.

8. The furnace of claim 1, further comprising a plurality of gas delivery lines, each gas delivery line having a first portion wrapped at least partially circumferentially about the portion of the process tube in the first region, and a second portion extending axially along the process tube in a second region adjacent the product support member, the length of the first portion being preselected to preheat gas in the gas delivery line to a predetermined temperature prior to passage of the gas through the second portion of the gas delivery line.

9. The furnace of claim 8, wherein the configurations of each gas delivery line are preselected to absorb substantially equal amounts of energy symmetrically from the process tube in the first region.

10. The furnace of claim 1, wherein the process tube and the gas delivery line are formed of a semiconductor grade quartz.

11. The furnace of claim 10, wherein the gas delivery line is fixedly attached to the process tube by a weld or welds.

12. The furnace of claim 1, wherein the gas delivery line is fixedly attached to the process tube.

13. The furnace of claim 1, wherein the gas distribution inlet is located at the second end of the process tube.

14. The furnace of claim 1, wherein the gas distribution inlet is located in a side of the process tube.

15. The furnace of claim 1, wherein the process tube is oriented vertically in the furnace.

16. The furnace of claim 1, wherein the process tube is oriented horizontally in the furnace.

17. A process tube for a furnace for processing product with a heated gas, comprising:
- a process tube disposable within a furnace housing and having opposed first and second ends, the process tube defining a process chamber therein for receiving product;
- a gas distribution inlet in the process tube to direct a gas into the process chamber;
- a gas output port in the process tube to remove gas from the process chamber;
- a gas input port disposed near the first end of the process tube;
- at least one gas delivery line disposed between the gas input port and the gas distribution inlet, and comprising a first portion wrapped at least partially circumferentially about a portion of the process tube in a first region between the opposed first and second ends, the length of the first portion being preselected to preheat gas in the gas delivery line to a predetermined temperature prior to the gas reaching a product region of the process chamber.

18. The process tube of claim 17, wherein the at least one gas delivery line further comprises a second portion extending axially along the process tube in a second region between the first region and the second end.

19. The process tube of claim 17, further comprising a further gas delivery line disposed between the gas input port and the gas distribution inlet, and having a further first portion wrapped at least partially circumferentially around the process tube in the first region, a length of the further gas delivery line being substantially equal to a length of the gas delivery line.

20. The process tube of claim 19, wherein the further gas delivery line comprises a further second portion extending axially along the process tube in a second region adjacent the product support member between the further first portion and the gas distribution inlet.

21. The process tube of claim 19, wherein the gas delivery line and the further gas delivery extend contiguously for a distance between the gas inlet port and the first portion and further first portion respectively.

22. The process tube of claim 19, wherein the gas delivery line and the further gas delivery line comprise a second portion and a further second portion respectively extending axially along the process tube in a second region adjacent the product support member from the first portion and the further first portion respectively to the gas distribution inlet, the second portion of the gas delivery line and the further second portion of the further gas delivery line being equidistantly spaced about the circumference of the process tube.

23. The process tube of claim 19, wherein the first portion of the first gas delivery line and the further first portion of the further gas delivery line comprise an equal number of lateral and axial segments, each segment having substantially equal lengths and occurring at generally identical locations along the first and further first portions.

24. The process tube of claim 17, further comprising a plurality of gas delivery lines, each gas delivery line having a first portion wrapped at least partially circumferentially about the portion of the process tube in the first region, and a second portion extending axially along the process tube in a second region adjacent the product support member, the length of the first portion being preselected to preheat gas in the gas delivery line to a predetermined temperature prior to passage of the gas through the second portion of the gas delivery line.

25. The process tube of claim 24, wherein the configurations of each gas delivery line are preselected to absorb substantially equal amounts of energy symmetrically from the process tube in the first region.

26. The process tube of claim 17, wherein the process tube and the gas delivery line are formed of a semiconductor grade quartz.

27. The process tube of claim 26, wherein the gas delivery line is fixedly attached to the process tube by a weld or welds.

28. The process tube of claim 17, wherein the gas delivery line is fixedly attached to the process tube.

29. The furnace of claim 17, wherein the gas distribution inlet is located at the second end of the process tube.

30. The furnace of claim 17, wherein the gas distribution inlet is located in a side of the process tube.

* * * * *